United States Patent [19]

Jett, Jr.

[11] Patent Number: 4,489,282
[45] Date of Patent: Dec. 18, 1984

[54] CMOS OP AMP BIAS CIRCUIT
[75] Inventor: William B. Jett, Jr., San Jose, Calif.
[73] Assignee: National Semiconductor Corporation, Santa Clara, Calif.
[21] Appl. No.: 472,302
[22] Filed: Mar. 4, 1983
[51] Int. Cl.³ .............................................. H03F 3/45
[52] U.S. Cl. .................................. 330/261; 330/253; 330/254
[58] Field of Search ............... 330/252, 253, 257, 261, 330/149, 254

[56] References Cited
U.S. PATENT DOCUMENTS
4,383,223 5/1983 Ulmer ............................ 330/253

Primary Examiner—James B. Mullins
Assistant Examiner—G. Wan
Attorney, Agent, or Firm—Gail W. Woodward; Paul J. Winters; Michael J. Pollock

[57] ABSTRACT

A CMOS op amp is disclosed in which one op amp is programmed with a controlled offset voltage and a reference current. The amplifier is constructed so that its gain adjusts to where its output current equals the reference current. Thus its $G_m$ equals the reference current divided by the offset voltage. Other such amplifiers can be slaved to the programmed amplifier so that a plurality of amplifiers can be simultaneously programmed.

8 Claims, 2 Drawing Figures

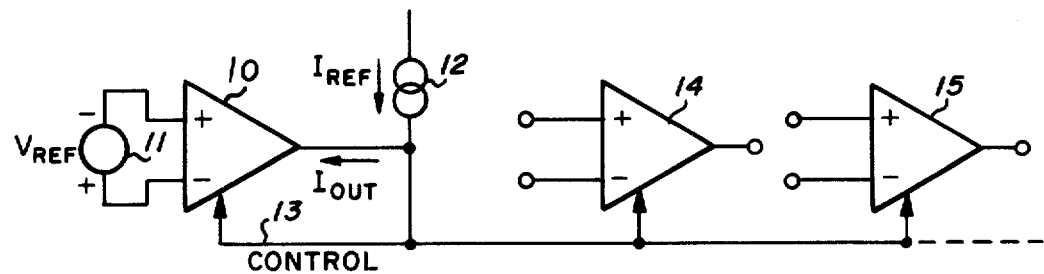
Fig_1
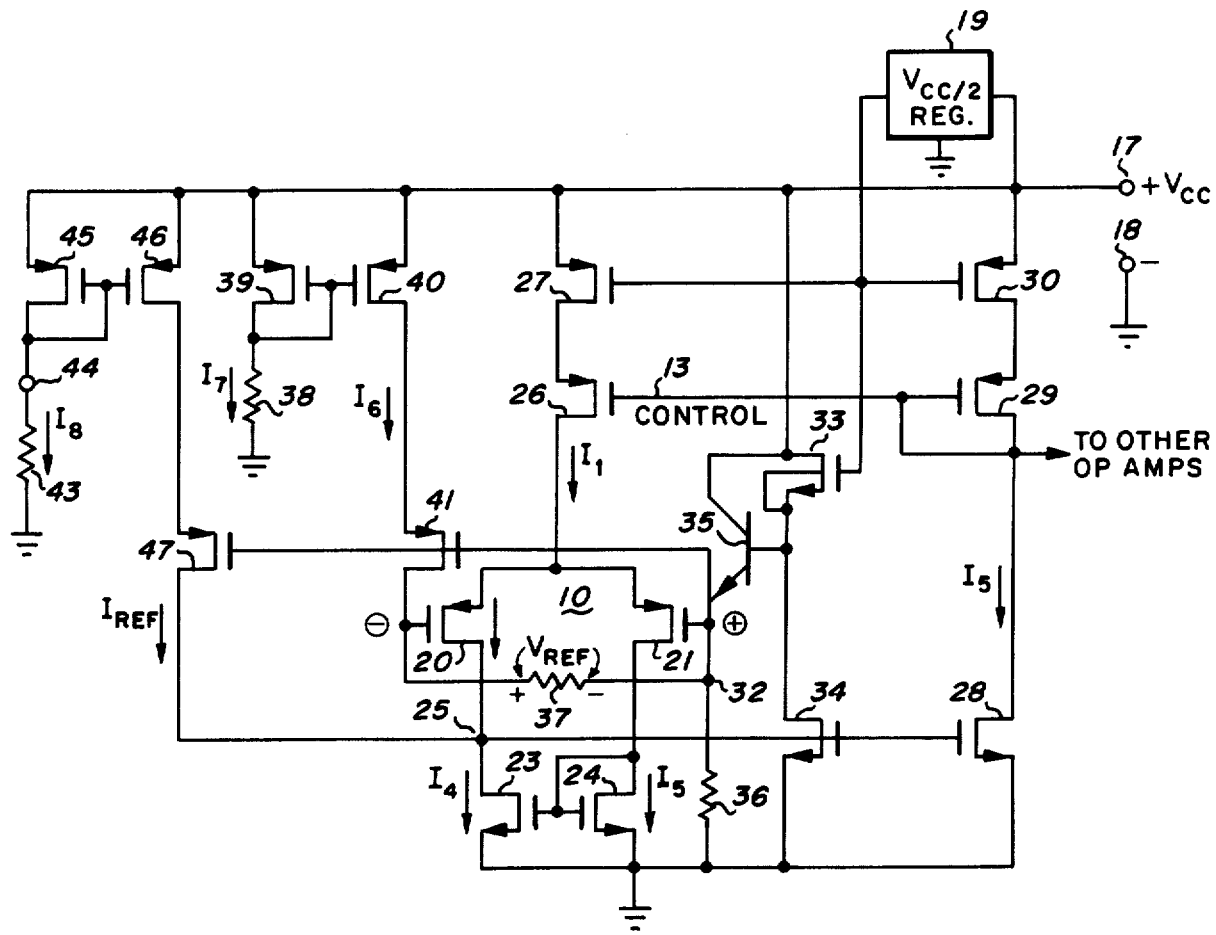
Fig_2

CMOS OP AMP BIAS CIRCUIT

BACKGROUND OF THE INVENTION

The invention relates to complementary metal oxide semiconductor (CMOS) structures as they exist in monolithic integrated circuit (IC) device. It would be useful to be able to program the gain, or transconductance, of operational amplifiers (op amps) by means of a resistor that is external to the IC chip and not subject to the variations in supply voltage or variations in device parameters that commonly accompany the fabrication process. Such an op amp could be referred to as a transconductance amplifier or $G_m$ amp.

In my copending application Ser. No. 460,325 filed Jan. 24, 1983, now U.S. Pat. No. 4,459,555 and titled MOS Differential Amplifier Gain Control Circuit, a circuit is disclosed for varying the gain of an op amp in response to a control voltage. The teaching in that application is incorporated herein by reference.

SUMMARY OF THE INVENTION

It is an object of the invention to program the transconductance of an op amp on a CMOS IC chip and to slave other op amps on the chip to the programmed one so that they all have similar transconductances.

It is a further object of the invention to apply a reference current and an offset voltage to an op amp which has a feedback loop that adjusts its output current to match the reference for a programmed transconductance so that other similar op amps can be slaved to the same value.

It is a still further object of the invention to develop an off chip current in an external resistor that can be used to program an op amp for a particular op amp transconductance in such a way that other op amps on the chip can be slaved to a similar transconductance value.

These and other objects are achieved as follows. A CMOS differential op amp is provided with an input offset voltage. The transconductance of the op amp is controlled by means of its tail current which in turn is obtained from a first current mirror having an input coupled to the op amp output. A controlled reference current is developed as a function of a resistor that is external to the chip and applied, via a second current mirror, to the op amp output. The resultant circuit will operate to cause the op amp tail current to adjust to that value which will occur for the offset voltage involved to produce the reference current output. The op amp transconductance will then be equal to the reference current divided by the offset voltage. Other similar op amps on the IC chip can be slaved to the controlled device by obtaining their tail currents from similar current mirrors connected to the controlled one. Thus the external resistor can be used to program the transconductances of a plurality of op amps.

BRIEF DESCRIPTION OF THE DRAWING

FIG. 1 is a block diagram showing a programmed op amp and slaved op amps coupled thereto.

FIG. 2 is a schematic diagram of a programmed op amp.

DESCRIPTION OF THE INVENTION

With reference to FIG. 1 op amp 10 represents a programmed amplifier. An input offset voltage source 11 is coupled as shown between the inverting and noninverting inputs so the op amp will sink an output current shown as $I_{OUT}$. A current source 12 is coupled to supply $I_{REF}$ to the output terminal. The transconductance of the op amp is controlled by line 13 which is connected to the output terminal to create a feedback loop. This will result in making $I_{REF} = I_{OUT}$. For this condition $G_m = I_{REF}/V_{REF}$. Control line 13 can be coupled directly to op amps 14 and 15, along with any others (not shown) so that programmed op amp 10 can be used to slave the transconductances of a plurality of other op amps. Such an arrangement is particularly useful in CMOS devices where substantial parameter variations are encountered in a production process.

The schematic diagram of FIG. 2 shows a circuit that includes a programmed op amp 10. A $V_{CC}$ power supply is coupled +to terminal 17 and −to ground terminal 18. Device 19, which is conventional, provides a source of $V_{CC}/2$ voltage for setting the circuit operating point as a function of the supply voltage. Transistors 20 and 21 are connected as a differential pair with transistors 23 and 24 providing a current mirror output load. Node 25 constitutes the op amp output, the gate of transistor 21 the noninverting input, and the gate of transistor 20 the inverting input.

The tail current, $I_1$ is supplied to the sources of differential transistors 20 and 21 by transistor 26 which is cascoded with transistor 27. The potential at the gate of transistor 26 is determined by control line 13 and will act to establish the op amp transconductance as follows.

A $V_{REF}$ potential is developed between the gates of transistors 20 and 21 as will be described hereinafter. This potential will offset op amp 10 so that $I_3$ exceeds $I_2$.

Node 25 is fed back to control line 13 by way of a current mirror that includes transistors 28–30. The gate of transistor 28 is coupled to node 25 so that it conducts $I_5$. Since transistor 29 has its drain returned to its gate and is cascoded with transistor 20, which is biased on by way of its $V_{CC}/2$ gate voltage, $I_5$ also flows in transistors 29 and 30. Thus, $I_1$ is a mirrored value related to $I_5$.

Transistors 23 and 24 are connected as a current mirror to serve as a differential to single ended output load for op amp 10. If these transistors are matched, the potential at node 25 will equal the potential at the drain of transistor 24 when $I_4 = I_3$. Since $V_{REF}$ acts to unbalance op amp 10 so that $I_3$ exceeds $I_2$, the amplifier will have a balanced output when $I_2 + I_{REF} = I_3$. This condition indicates that op amp 10 will sink $I_{REF}$ for the balanced condition. If $I_4$ is less than $I_3$ conduction in transistor 23 will pull node 25 down and if $I_4$ exceeds $I_3$ the $V_{REF}$ source will pull node 25 up. Thus, the load transistors 23 and 24 form a comparator that has an output voltage that is a function of their current relationships. This voltage in turn determines the current $I_5$ flowing in transistor 28.

Normally transistor 28 is made to have a conduction that is equal to the combined conduction in transistors 23 and 24. Thus, when node 25 is at the same potential as the drain of transistor 24, $I_5 = I_4 + I_3$. This current is reflected via transistors 26 and 29 (which are matched) as $I_1$ which is spilt into $I_2$ and $I_3$ by transistors 20 and 21. This means that a stable condition is met where $I_2 + I_{REF} = I_3 = I_4$. This means that the output current sinking of op amp 10 is equal to $I_{REF}$. In the event that $I_2 + I_{REF}$ is less than $I_3$ the potential at node 25 will fall thereby reducing conduction in transistor 28 and transistor 26. This will reduce $I_1$ until a balance is achieved. If $I_2 + I_{REF}$ exceeds $I_3$ the potential at node 25 will rise thereby increasing conduction is transistor 28 and I₁. This will increase I₃ until a match is achieved.

From the above it can be seen that the circuit acts to sink $I_{REF}$ as a function of $V_{REF}$ thus programming a controlled value of transconductance for op amp 10.

Circuit node 32 is clamped at a potential slightly below $V_{CC}/2$ to place op amp 10 well within its common mode range. Transistors 33 and 34 form a voltage divider across the $V_{CC}$ line to ground. Since the gate of transistor 33 is at $V_{CC}/2$ its source will be close to one N channel transistor threshold below $V_{CC}/2$. Thus, the base of transistor 35, which is a well-known parasitic NPN transistor in common use in CMOS structures, will be clamped. Its emitter will be about one $V_{BE}$ below its base. This places node 32 at $V_{CC}/2 - V_{TN} - V_{BE}$. Looking into the emitter of transistor 35 node 32 will see a relatively low impedance clamped potential. Resistor 36 returns node 32 to ground and determines the conduction in transistor 35.

Resistor 37 couples node 32, which represents the clamped noninverting op amp input, to the inverting input at the gate of transistor 20. The voltage drop across resistor 37 is the op amp offset or $V_{REF}$ and is created using $I_6$ as follows.

$I_6$, which flows in resistor 37, is the mirror of $I_7$ which is caused to flow in resistor 38. Since the gate of transistor 39 is returned to its drain, $I_7 = (V_{CC} - V_{TP39})/R_{38}$ where $V_{TP39}$ is the threshold voltage of transistor 39 and $R_{38}$ is the resistance of resistor 38. Since the gate of transistor 40 is connected to the gate of transistor 39, $I_6$ will mirror $I_7$. However, if transistors 39 and 40 are ratioed, the currents will be ratioed. Typically $I_6$ will be made about 10% of $I_7$. Also typically, resistor 37 will be made about 1/6 of the value of resistor 38. Accordingly, $V_{REF}$ which appears across resistor 37 will be:

$$V_{REF} = \frac{V_{CC} - V_{TP39}}{R_{38}} \times \frac{W_{40}}{W_{39}} \times R_{37}$$

where $W_{40}/W_{39}$ is the ratio of transistors 40 and 39. It can be seen that $V_{REF}$ is determined by $V_{CC}$ and two geometrical ratios that can be fixed as design values. Using the above mentioned ratios $V_{REF}$ will be slightly below 1/60 of $V_{CC}$. This provides a substantial but not excessive value of op amp offset. Transistor 41 which has its gate returned to node 32 acts to cascode the source of $I_6$.

$I_{REF}$ is programmed by external resistor 43 which is user selectable by virtue of terminal 44. $I_8$ which flows in resistor 43 also flows in transistor 45 so that it is mirrored in transistor 46 to produce $I_{REF}$. Transistor 47 which has its gate returned to node 32 cascodes $I_{REF}$. The value of $I_{REF}$ flowing into node 25 will be:

$$I_{REF} = \frac{V_{CC} - V_{TP45}}{R_{43}} \times \frac{W_{46}}{W_{45}}$$

Combining the above two equations gives:

$$\frac{I_{REF}}{V_{REF}} = \frac{\frac{V_{CC} - V_{TP45}}{R_{43}} \times \frac{W_{46}}{W_{45}}}{\frac{V_{CC} - V_{TP39}}{R_{38}} \times \frac{W_{40}}{W_{39}} \times R_{37}}$$

Since $I_{REF}/V_{REF}$ is the transconductance of op amp 10 this reduces to:

$$G_m = \frac{V_{CC} - V_{TP45}}{V_{CC} - V_{TP39}} \times \frac{R_{38}}{R_{37}} \times \frac{W_{46}}{W_{45}} \times \frac{W_{39}}{W_{40}} \times \frac{1}{R_{43}}$$

If transistors 39 and 45 are matched, the first term reduces to unity and $G_m$ reduces to the reciprocal of resistor 43 multiplied by geometrically determined ratios. If the current mirror transistor ratios are each equal to 10:1 the combined third and fourth terms reduce to unity. Then if resistor 38 is made six times the value of resistor 37, as mentioned above, the formula finally reduces to:

$$G_m = \frac{6}{R_{43}}$$

Thus if resistor 43 is made $10^3$ ohms, the value of $G_m$ would be 6 millimhos.

Control line 13 can be coupled to the tail current source transistors in other op amps that duplicate op amp 10 except for having their imput terminals accessible. By programming the $G_m$ of op amp 10 all of the interconnected op amps will be slaved to the same $G_m$.

EXAMPLE

The circuit of FIG. 2 was constructed with control line 13 being coupled to the tail current transistors feeding separate op amps that were constructed like op amp 10 except that no offset bias was applied to their input terminals. The following transistor size ratios were used:

| DEVICE | W/L (MICRONS) |
| --- | --- |
| 20, 21 | 70/10 |
| 23, 24, 33, 34 | 80/10 |
| 26, 29 | 240/10 |
| 27, 30 | 40/5 |
| 28 | 160/10 |
| 39, 45 | 100/5 |
| 40, 41, 46, 47 | 10/5 |

Resistors 36–38 were made respectively 40K, 14.3K, and 86K ohms respectively. When resistor 43 made 10K ohms, op amp 10 was programmed for a transconductance of 0.0006 mhos. The other op amps had the same transconductance to within ±10%.

The invention has been described and a CMOS version detailed. When a person skilled in the art reads the foregoing description, alternatives and equivalents, within the spirit and intent of the invention, will become apparent. For example, while CMOS is shown other approaches, such as NMOS, will apply. Accordingly, it is intended that the scope of the invention be limited only by the claims that follow.

I claim:

1. A programmed differential operational amplifier circuit having a pair of input terminals and an output terminal, said circuit comprising:
   means for generating a reference current;
   means for applying an offset potential between said pair of input terminals whereby an output current is created;
   means for comparing said reference current with said output current; and
   means responsive to said comparing to adjust the transconductance of said amplifier to where said output current equals said reference current whereby said amplifier has a transconductance equal to said reference current divided by said offset potential.

2. The circuit of claim 1 wherein said offset potential is poled so that said amplifier sinks current and said reference current is developed in a current source.

3. The circuit of claim 2 wherein said differential amplifier incorporates a differentially operated transistor pair in which the amplifier transconductance is related to the tail current of said pair and said means for comparing is combined with the transistor pair load.

4. The circuit of claim 3 wherein said load includes a differential to single ended output first current mirror.

5. The circuit of claim 4 further comprising a second current mirror having an input coupled to said first current mirror output and an output coupled to supply tail current to said transistor pair thereby creating a feedback loop around said pair.

6. The circuit of claim 5 wherein said second current mirror output is coupled to other similar operational amplifiers whereby the transconductance in said programmed operational amplifier is the same in all of said operational amplifiers.

7. The circuit of claim 6 wherein said operational amplifiers are constructed in integrated circuit chip form and said means for generating a reference current includes a resistor that is external to said chip whereby the transconductance of said operational amplifiers can be programmed by selecting the value of said resistor.

8. The circuit of claim 7 wherein said chip is constructed in CMOS form.

* * * * *